(12) United States Patent
Cesari et al.

(10) Patent No.: US 6,411,976 B1
(45) Date of Patent: Jun. 25, 2002

(54) EFFICIENT FILTER IMPLEMENTATION

(75) Inventors: Richard Adam Cesari, Dallas, TX (US); Xiao-An Wang, Allentown, PA (US)

(73) Assignee: Agere Systems Guardian Corp., Orlando, FL (US)

( * ) Notice: Subject to any disclaimer, the term of this patent is extended or adjusted under 35 U.S.C. 154(b) by 0 days.

(21) Appl. No.: 09/131,929

(22) Filed: Aug. 10, 1998

(51) Int. Cl.$^7$ .............................................. G06F 17/10
(52) U.S. Cl. ...................................................... 708/319
(58) Field of Search ................................ 708/300, 301, 708/319, 307, 313, 315, 316

(56) References Cited

U.S. PATENT DOCUMENTS

| | | | | |
|---|---|---|---|---|
| 3,979,701 A | * | 9/1976 | Tomozawa | 333/166 |
| 5,126,682 A | * | 6/1992 | Weinberg et al. | 329/304 |
| 5,448,507 A | * | 9/1995 | Strawn et al. | 708/425 |
| 5,623,318 A | * | 4/1997 | Lee | 348/614 |
| 5,831,880 A | * | 11/1998 | Lee | 708/319 |

* cited by examiner

*Primary Examiner*—Ohuong Dinh Ngo
(74) *Attorney, Agent, or Firm*—Henry E. Schanzer, Esq

(57) ABSTRACT

An N-stage finite impulse response (FIR) filter embodying the invention includes a first filter section whose filter coefficients are made either 1 or zero (rather than 1 and −1) in order to produce a first output (i.e., C1) and a second filter section for producing a second output (i.e., C2), which when combined (added to or subtracted from) with the first output produces an output function (i.e., $C_n$) which is equal to that produced by an N-stage FIR filter implementing filter coefficients having a value of either 1 or −1. In a preferred embodiment, the first filter section computes the function $$C1 = \sum_{k=0}^{N-1} y(n-k) \cdot \frac{x(k)+1}{2};$$

and the second filter section computes the function $$C2 = \sum_{k=0}^{N-1} y(n-k).$$

The functions C1 and C2 may be combined to produce an output function equal to 2[C1−(½)C2] or 2C1−C2.

65 Claims, 11 Drawing Sheets

EFFICIENT FILTER IMPLEMENTATION

TECHNICAL FIELD

This invention relates to digital filters useful in environments where power consumption must be reduced such as in wireless telephone systems, and, more particularly, in code division multiple access (CDMA) wireless telephone terminals.

BACKGROUND OF THE INVENTION

Finite impulse response (FIR) filters can be implemented in several forms, the most popular of which are the transversal and direct implementations. An FIR filter of order N performs the dot product of a received sample vector [y(n)] and a filter coefficient vector [X(n)], both of length N. The received filter vector, made up of values stored in registers (memory elements) of the filter, is updated each clock cycle by eliminating the oldest value in the vector, shifting the received filter vector values toward the position of the eliminated value, and appending the new filter value at the opposite end of the received filter vector. The successive dot products create an FIR convolution.

More specifically, when a transversal filter is implemented with filter coefficients (tap weight vectors) that are either −1 or 1, the output function, $C_n$, of the filter may be mathematically described by the equation:

$$C_n = \sum_{k=0}^{N-1} y(n-k) \cdot x(k) \qquad \text{eq. 1}$$

where, $C_n$ is the filter output; y(n−k) is the filter input at time n−k; x(k) is the filter coefficient for the $k^{th}$ stage of the filter; and N is the number of stages in the filter; with each stage including at least one multiplier. At each clock cycle, for each stage of the filter, the incoming sample is multiplied by the filter coefficient for that stage. Each resulting product, which is the weighted sample input for a stage, is added to the value of its respective preceding stage of the filter, or zero if there is no preceding stage, and stored for use on the next clock cycle.

FIG. 1 shows an exemplary, prior art, N-stage transversal filter for performing such FIR filtering with coefficients that are either −1 or 1. Each stage includes a two input multiplier (101$i$), a register (105$i$) and a two input port adder (103$i$). Each multiplier 101$i$ multiplies an incoming sample y(n) with a respective one of filter coefficients $X_0$ through $X_{N-1}$. The output of each multiplier 101$i$ is supplied to an input port of a corresponding adder 103$i$, except for the output of multiplier 101-N receiving coefficient $X_{N-1}$, whose output is supplied directly to the input of register 105(N−1) furthest from output $C_n$. The output of multiplier 101-N, receiving coefficient $X_{N-1}$ is supplied directly to the input of register 105(N−1) because there is no prior stage of the filter to feed into this stage, and so, if this stage had an adder, its inputs would be the sample and 0, which renders its function unnecessary. One input port of each adder (103$i$) is supplied with the output of its corresponding multiplier (101$i$), and the other input port is supplied with the output that was stored during the immediately preceding clock cycle in its corresponding register 105$i$.

The adder 103$i$ of each stage sums the outputs of its multiplier 101$i$ and the outputs of its associated register 105$i$. The output port of each adder is connected to the input port of the next register 105 along the filter chain towards the output $C_n$.

To implement the output function $C_n$ of eq. 1, the input samples [y(n)] are multiplied by filter coefficients [X(n)] selected to be either 1 or −1. To effectuate this computation using a two's complement operation results in several problems associated with the circuit of FIG. 1, which may be explained by reference to FIGS. 1A, 1B, 1C and 1D and by noting that each input sample is comprised of a number of bits. For purpose of illustration, it is assumed that each input sample consists of 4 bits (e.g., A0, A1, A2, A3). Note also that in order to multiply the input samples by filter coefficients of 1 and −1, each multiplier 101 must include, for each bit being multiplied, a summing circuit, 12, and a carry circuit, 13, as shown for blocks 11a, 11b, 11c, and 11d in FIG. 1A. The summing circuit 12, for each multiplier bit, may be implemented as shown in FIG. 1B and the carry circuit 13, for each multiplier bit, may be implemented as shown in FIG. 1C.

Furthermore, as shown in FIG. 1D, each multiplier 101$i$ may be required to have five outputs; i.e., one output for each of the four bits and one output for the carry. This requires that even the left most register (105-N−1) in FIG. 1 may need five inputs. Consequently, even register 105-N−1 may need to have five (5) outputs coupled to the next adder down the line. The next adder down the line must be capable of adding the outputs of its associated register and the outputs of its associated multiplier resulting in an increasing number of outputs being supplied down the filter chain. Hence, as a result, the size of the adders and registers along the filter chain increase and, where a filter has a large number of stages, the size of the adders and registers may increase substantially.

Therefore it is evident from FIGS. 1A, 1B, 1C and 1D that the multiplier circuitry for enabling multiplication by coefficients which are 1 or −1 is highly complex. It should also be noted that a significant amount of power is dissipated in the multiplier circuit due to the substantial amount of switching being performed by the highly complex circuitry. In addition, there is also a significant amount of switching and ensuing power dissipation in the adder circuits (103-$i$) along the filter chain.

By way of example, it may be desirable to form these filter circuits using complementary metal oxide semiconductor (CMOS) components because of their extremely low power consumption; i.e., they do not consume power when the bit values in the circuits are constant. However, when CMOS circuits are switched (toggled) in value, i.e., changed from 0 to 1 or from 1 to 0, power is consumed. Applicants recognized that when the filter coefficients call for multiplication by −1, as is required by the prior art filter, many bits are caused to change in value. So does the rippling of changes in bit values while adders 103 perform their calculations. All of these bit changes cause a substantial amount of power consumption even when the circuits of FIG. 1 are implemented using CMOS components.

Moreover, in the case where noise is expected at the output of the filter, the values at the intermediate stages in the prior art filter will be in the neighborhood of zero, and so the values are often changing between small positive and negative values. These changes in value result in a large number of the bits which are used to represent the values toggling from 0 to 1 or from 1 to 0. This toggling causes power consumption even when the circuits of FIG. 1 are implemented using CMOS circuitry.

SUMMARY OF THE INVENTION

Applicants recognized that a high level of circuit complexity and a high degree of power dissipation exists in the filter circuit formed in accordance with the prior art because the filter coefficients (or tap weight vectors) were selected to be either 1 or −1.

Applicants' invention resides, in part, in the recognition that the multipliers (101) in the circuit of FIG. 1 may be greatly simplified with much power savings and that the power dissipated in the adders (103) may also be greatly reduced by having a first filter section whose filter coefficients are made either 1 or zero (rather than 1 and −1) in order to produce a first output (i.e., C1) and by adding a compensation network for producing a second output (i.e., C2), which when combined (added to or subtracted from) with the first output produces the output function (i.e., $C_n$) of equation 1, above.

Applicants invention also resides, in part, in the recognition that equation 1 may be recast as a first summation to produce a first output (C1) and a second summation to produce a second output (C2), and that C1 and C2 may be combined (added or subtracted) to produce the desired filter output ($C_n$) specified in eq. 1, above.

Applicants recognized that eq. 1 which represents the dot product of the received sample vector and the filter coefficient (tap weight) vector may be rewritten as:

$$C_n = 2\left[\sum_{k=0}^{N-1} y(n-k) \cdot \frac{x(k)+1}{2} - \frac{1}{2}\sum_{k=0}^{N-1} y(n-k)\right]; \quad \text{eq. A}$$

Which can alternatively be written as:

$$C_n = \left[2\sum_{k=0}^{N-1} y(n-k) \cdot \frac{x(k)+1}{2} - \sum_{k=0}^{N-1} y(n-k)\right]; \quad \text{eq. B}$$

where $C_n$ is the filter output; y(n−k) is the filter input at time n−k; x(k) is the filter coefficient for the $k^{th}$ stage of the filter which may be −1 or 1; and N is the number of stages in the filter. Thus, the effective new coefficients $$\frac{x(k)+1}{2},$$

may be represented as $\tilde{x}(k)$, where $\tilde{x}(k)$ takes on values of 0 or 1. In other words, the dot product may be written as:

$$C_n = 2\left[\sum_{k=0}^{N-1} y(n-k) \cdot \tilde{x}(k) - \frac{1}{2}\sum_{k=0}^{N-1} y(n-k)\right] \quad \text{eq. 2}$$
$$= 2[C1 - 1/2\, C2],$$

which can alternatively be written as:

$$C_n = \left[2\sum_{k=0}^{N-1} y(n-k) \cdot \tilde{x}(k) - \sum_{k=0}^{N-1} y(n-k)\right] = [2C1 - C2]. \quad \text{eq. 3}$$

The output function Cn may thus be expressed as a function of two products C1 and C2; where $$C1 = \sum_{k=0}^{N-1} y(n-k) \cdot \frac{x(k)+1}{2}; \text{ and}$$

$$C2 = \sum_{k=0}^{N-1} y(n-k).$$

Advantageously, a filter structure implementing the filtering according to either equations 2 or 3 consumes less power, and is simpler, than the filter structure of the prior art. In particular, in a filter formed according to equation 2 or 3, multiplication by −1 is eliminated, thus reducing power consumption from the changes in bit values necessitated by such multiplication and simplifying the structure. Additionally, the values at the adders of the intermediate stages of the filter used to form the product C1 are in the neighborhood of some mid-range value, rather than zero. As a result, the number of bits that change state is reduced, which, advantageously, further reduces the power consumption of the FIR filter.

Applicants' invention also resides in the recognition that the "multipliers" in each stage of an N-stage FIR filter section, where the filter coefficients are either 1 or 0, may take the form of relatively simple logic elements to produce a first element (C1).

Applicants' invention also resides in the recognition that, in an N-stage FIR filter, an adder for summing the outputs of a multiplier of a stage with the outputs of the register of that stage may be by-passed when the filter coefficient applied to the multiplier of that stage is 0. This feature enables a substantial reduction in the power dissipation of the adders needed to supply signals to the subsequent registers along the filter chain.

Thus, where the adder of a stage adds (sums) the outputs of its associated multiplier with the outputs of its associated (first) register and supplies a summed output to the inputs of a subsequent (second) register along the filter chain, the adder of the stage may be bypassed for certain operating conditions. Thus, when an adder is connected between the outputs of a first register and the inputs to a second register, the adder may be bypassed in several different ways. In one embodiment, a first selectively enabled gating circuit (e.g., T3 in FIG. 4) may be coupled between the outputs of the first register and the inputs of the second register for, when enabled, shunting the adder. In another embodiment of the invention, a second selectively enabled gating circuit (e.g., T2 in FIG. 4) may be coupled between the outputs of the adder and the inputs to the second register. In still a third embodiment, a third selectively enabled gating circuit (e.g., T1 in FIG. 4) may be coupled between the outputs of the first register and the inputs to the adder. When the filter coefficient applied to the multiplier of a stage is 1 (or 0), the first gating circuit is disabled and the second and third gating circuits, when present, are enabled. When the filter coefficient applied to the multiplier of a stage is 0 (or 1), the first gating circuit is enabled to directly couple the outputs of the first register to the inputs of the second register and the second and third gating circuits, when present, are disabled to decouple the adder from the filter circuit. The adder networks which are bypassed should not dissipate any power. Statistically, half of the filter coefficients will be 0, hence in comparison to the prior art there is a substantial savings in the power dissipated by the adder circuitry along the filter chain.

BRIEF DESCRIPTION OF THE DRAWING

In the accompanying drawing like reference characters denote like components.

DETAILED DESCRIPTION

Figure 1:
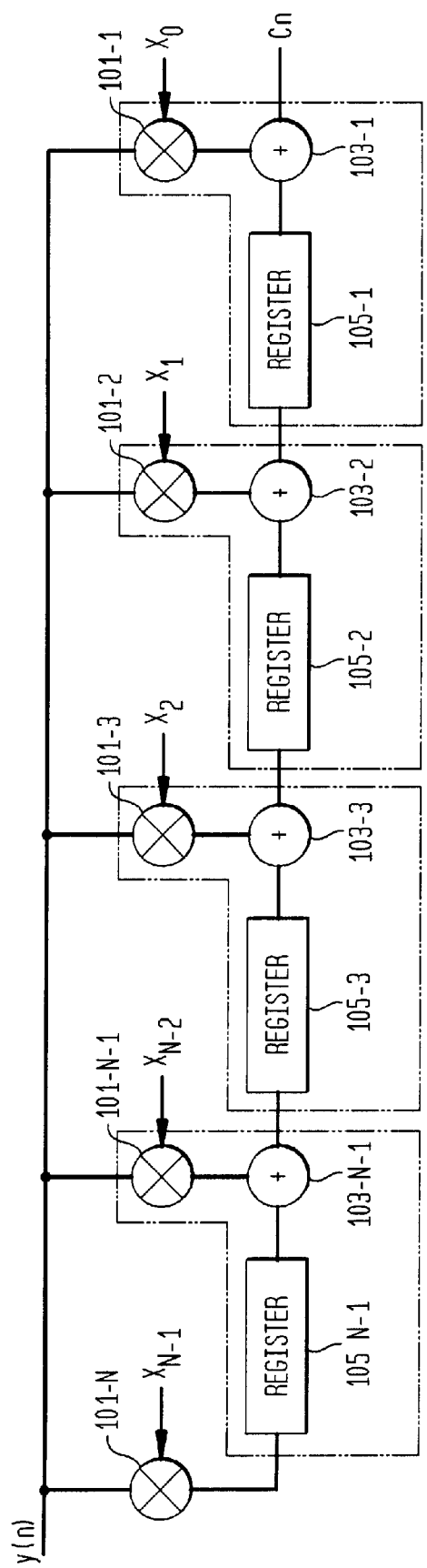
FIG. 1 is a block diagram of a prior art transversal filter for performing FIR convolution.
Figure 1A:
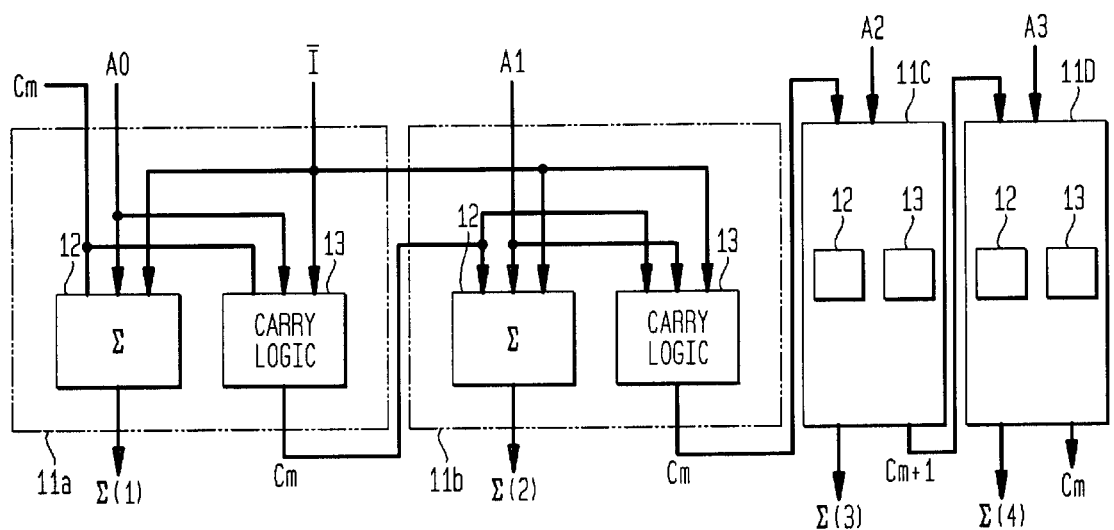
FIG. 1A is a block diagram of a multiplier circuit suitable for use in the circuit of FIG. 1.
Figure 1B:
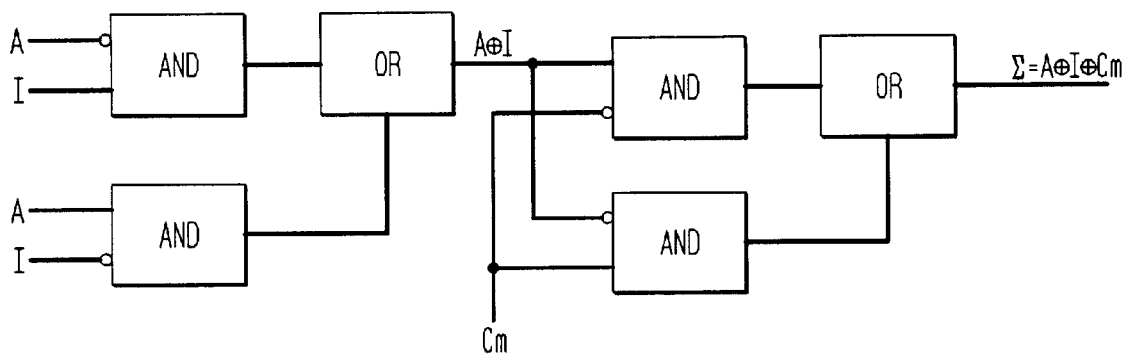
FIG. 1B is a block diagram of a summer circuit suitable for use in the multiplier of FIG. 1A.
Figure 1C:
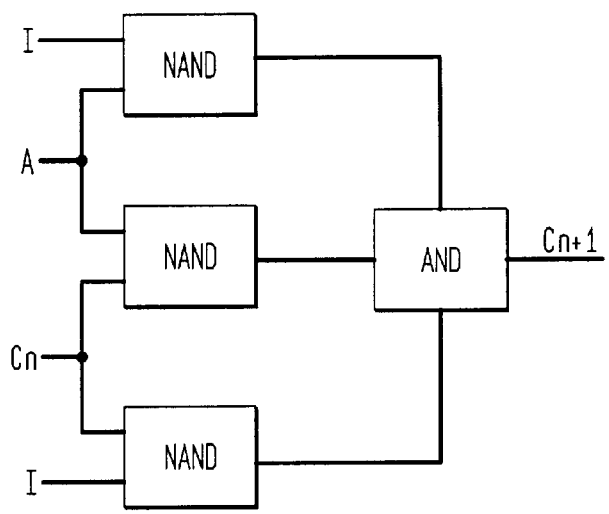
FIG. 1C is a block diagram of a carry circuit suitable for use in the multiplier circuit of FIG. 1A.
Figure 1D:
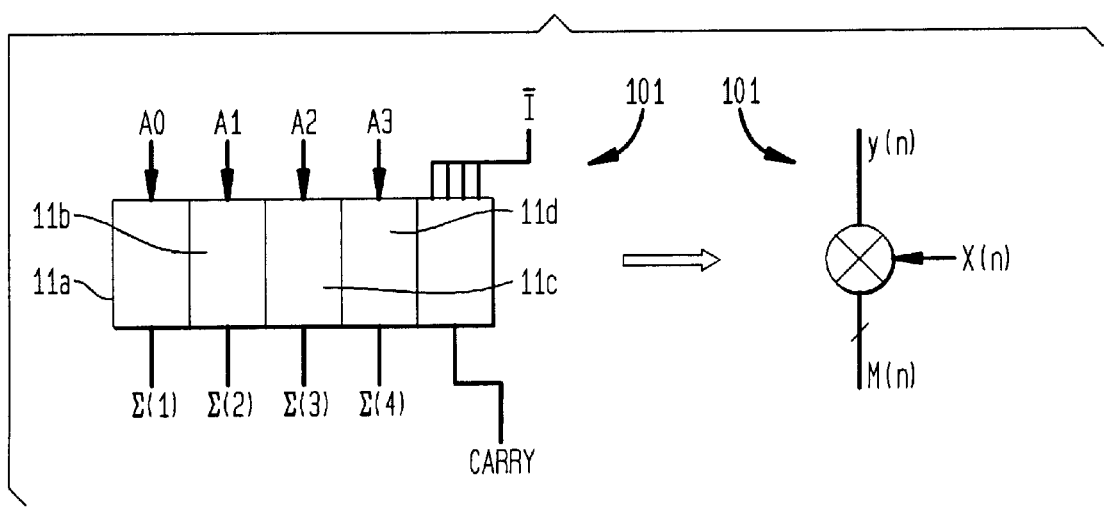
FIG. 1D is a symbolic representation of the multiplier circuit of FIG. 1A.
Figure 2:
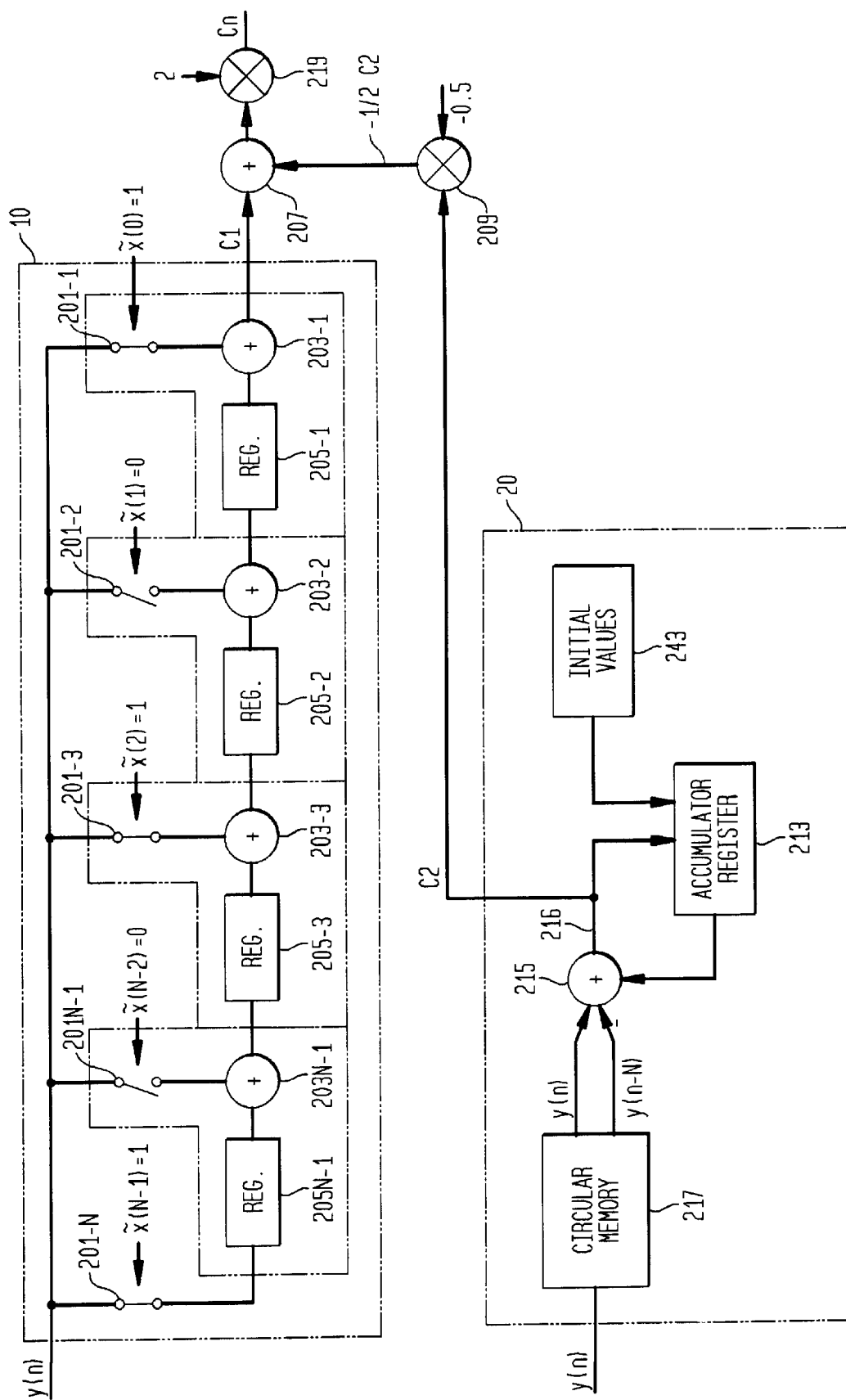
FIG. 2 shows a structure for implementing the filter of FIG. 1 but restructured in accordance with the principles of the invention.

FIG. 2 shows an FIR filter structure for implementing the filter function of FIG. 1 in accordance with the invention. The filter of FIG. 2 includes a first filter section 10 in which the filter coefficients applied to the various stages are either 1 or 0 for producing a first output, C1, a second section 20 for producing a second output, C2, and combination circuitry for combining C1 and C2 for producing a filter output $C_n$ which is equal to the output produced by the FIR filter of FIG. 1 and satisfying equation 1 for the condition where the filter coefficients are 1 and −1. Before discussing the filter structures in greater detail, it is again noted that applicants recognized that filter computations can be simplified and the power consumption for such a filter reduced, in accordance with the principles of the invention, by employing a first filter section 10 in which the coefficient values are either 0 or 1 (rather than −1 or 1), and then compensating for the selected coefficient values by means of a second filter section 20 whose output is then combined with the output of the filter section 10 to produce the desired results obtained with the N-stage FIR filter of the prior art shown in FIG. 1.

As noted above the filter equation to be satisfied by the circuits of the invention may be expressed as follows:

$$C_n = \sum_{k=0}^{N-1} y(n-k) \cdot x(k) \qquad \text{eq. 1}$$

The dot product of equation 1 may be rewritten, in accordance with aspects of the invention, already noted above, as:

$$C_n = 2\left[\sum_{k=0}^{N-1} y(n-k) \cdot \frac{x(k)+1}{2} - \frac{1}{2}\sum_{k=0}^{N-1} y(n-k)\right] \qquad \text{eq. 2}$$

$$= 2\left[\sum_{k=0}^{N-1} y(n-k) \cdot \tilde{x}(k) - \frac{1}{2}\sum_{k=0}^{N-1} y(n-k)\right]$$

Or $$C_n = \left[2\sum_{k=0}^{N-1} y(n-k) \cdot \frac{x(k)+1}{2} - \sum_{k=0}^{N-1} y(n-k)\right] \qquad \text{eq. 3}$$

$$= \left[2\sum_{k=0}^{N-1} y(n-k) \cdot \tilde{x}(k) - \sum_{k=0}^{N-1} y(n-k)\right]$$

Where $C_n$ is the filter output; y(n−k) is the filter input at time n−k; x(k) is the filter coefficient for the $k^{th}$ stage of the filter which may be −1 or 1; and N is the number of stages in the filter. Thus, the effective new coefficients $$\frac{x(k)+1}{2},$$

may be represented as $\tilde{x}(k)$, where $\tilde{x}(k)$ takes on values of 0 or 1. In other words, the dot product may be rewritten as $C_n=2[C1-(\frac{1}{2})C2]$ in accordance with equation 2 or as $C_n=2C1-C2$ in accordance with equation 3, where $$C1 = \sum_{k=0}^{N-1} y(n-k) \cdot \frac{x(k)+1}{2}; \text{ and}$$

$$C2 = \sum_{k=0}^{N-1} y(n-k).$$

Referring back to FIG. 2 and in accordance with an aspect of the invention. Switches 201 implement the effective new coefficients $\tilde{x}(k)$. Each switch 201 is j bits wide, the width of each sample y(n). For purpose of illustration, it is assumed in the discussion to follow that, when the value of $\tilde{x}(k)$ applied to a switch 201 is 1, that switch 201 is closed; and when the value of $\tilde{x}(k)$ applied to the switch is 0, the switch is open so the value of sample y(n) is prevented from passing through the open switch and instead a 0 is supplied at the output of the multiplier (switch) 201. In other words, for each stage of the filter structure 10 implementing the invention, either the received sample value, or nothing, is added to the output of the register from the prior stage. Advantageously, there is no longer any multiplication by −1, as in the prior art filter structure of FIG. 1, and so the circuit is simplified and power consumption is reduced.

Figure 6A:
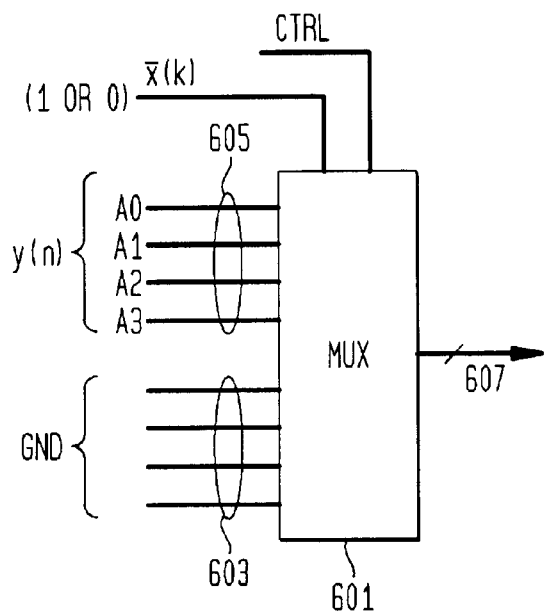
FIGS. 6A and 6B show different circuits suitable for use to implement the multiplier (switch) function used in FIGS. 2, 3, 4, and 7 for multiplying by 0 or 1.

More specifically, FIG. 6A shows an implementation of a switch ("multiplier")201 suitable for use in filters embodying the invention. One port 603 of a multiplexer 601 is supplied with all zeros (GND) while the other port 605 is supplied with the sample value y(n). When the value of $\tilde{x}(k)$ is 0, the port 603 of multiplexer 601 that is supplied with all zeros is selected, in response to a control signal, CTRL, to be passed to the output port 607 of multiplexer 601. When the value of $\tilde{x}(k)$ is 1, the port 605 of multiplexer 601 that is supplied with the values of y(n) is selected, in response to control signal, CTRL, to be passed to the output port 607 of multiplexer 601. Advantageously, a single multiplexer is needed to perform the multiplication. Not only is this simpler, but it consumes less power, as the value of the input sample y(n) need not be changed. Furthermore, when the filter coefficient is 0, there is no rippling of values through an associated adder.

Figure 6B:
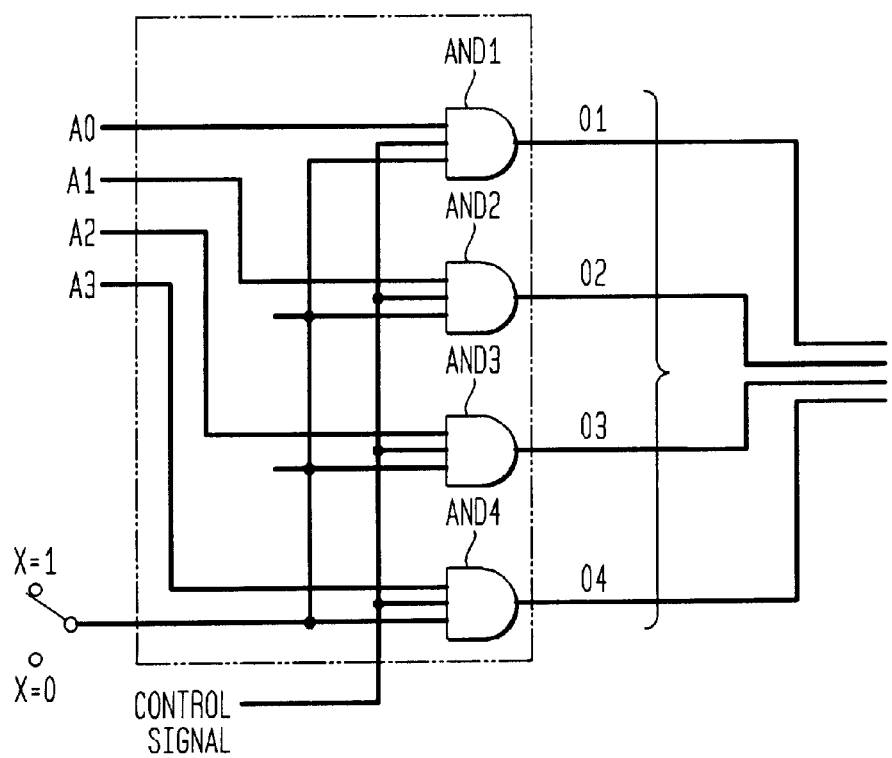

FIG. 6B shows an alternative logic element suitable for use as a switch (multiplier) 201. The circuit of FIG. 6B is a simple logic gate arrangement for performing the multiplication function. Where the input vector y(n) consists of 4 bits, four AND gates (AND1–AND4) would be required to handle the values of y(n). The values of X(n) would also be supplied to the inputs of the AND gates as shown in FIG. 6B; where X(n) is either 0 or 1. Hence, when X(n) is zero, the outputs of the AND gates is zero and when X(n) is 1, the outputs of the AND gates is equal to y(n) or corresponding values. A control signal may be supplied to the AND gates to control the point in time when the switching (multiplication) occurs. Note that in the multipliers formed in accordance with the invention there is no need for a carry line for the circuits of FIGS. 6A and 6B.

Returning to FIG. 2, adders 203 and registers 205 operate in a similar manner to adders 103 and registers 105, respectively, of FIG. 1. The first output (C1) from adder 203-1 is supplied as an input to an adder 207. Because of the restructuring, when noise is expected at the output of the filter, the values at adder 203 will typically be in the neighborhood of some mid-range value rather than typically being small positive or negative values in the neighborhood of zero, thus lowering the toggling activity of the bits at adders 203. As a result, advantageously, when the circuit of FIG. 2 is implemented using CMOS circuits, power consumption is reduced, in comparison to the prior art filter.

In the circuit of FIG. 2, the output C1 generated with effective new filter coefficients of 0 and 1 at the output of adder 203-1 is adjusted by subtracting $$\left[\frac{1}{2}\sum_{k=0}^{N-1} y(n-k)\right]$$

which is equal to ½ C2 from C1 and multiplying the resulting value by 2 to produce $C_n$. In FIG. 2, C2 is generated by means of a circularly addressed memory 217, a summer 215, and an accumulator register 213. The adder 215 has an output 216, which defines C2, and which is fed to an input port of a −0.5 multiplier 209. Circularly addressed memory 217, summer 215, accumulator register 213, multiplier 209 operate to develop one half the sum of each of the N latest sample values, i.e., to compute $$\frac{1}{2}\sum_{k=0}^{N-1} y(n-k),$$

which is defined herein as (½)C2.

In particular, circularly addressed memory 217 has the capacity to store N samples. The N latest sample values are stored in circularly addressed memory 217. The 268 oldest sample value stored in circularly addressed memory 217 and the current sample value are supplied to summer 215. Summer 215 takes as an input the output from accumulator register 213, adds to it the current sample value y(n), subtracts from it the oldest sample value y(n−N), and supplies at its output 216 the resulting sum (C2) to one input of multiplier 209 and also to the input of accumulator register 213 to be stored therein.

When the filter of FIG. 2 starts operation it is desirable to supply a value to be employed by accumulator register 213 that compensates for the fact that circularly addressed memory 217 initially has zero values in it. This value is supplied by initial values unit 243. The value to be supplied by initial values unit 243 for particular applications is known to those of ordinary skill in the art of filter design.

Multiplier 209 multiplies the sum from summer 215 by the constant value of negative one-half (−1.5) and supplies the result to adder 207. Adder 207 adds its inputs, C1 and (−½)C2, and supplies the result to a multiplier 219, which multiplies its input by 2 to produce the output $C_n$. The result $C_n$ is supplied as the overall output of the filter implementation, which is the same $$C_n = \sum_{k=0}^{N-1} y(n-k) \cdot x(k),$$

described as the result of eq. 1, above, and computed by the prior art filter.

Figure 3:
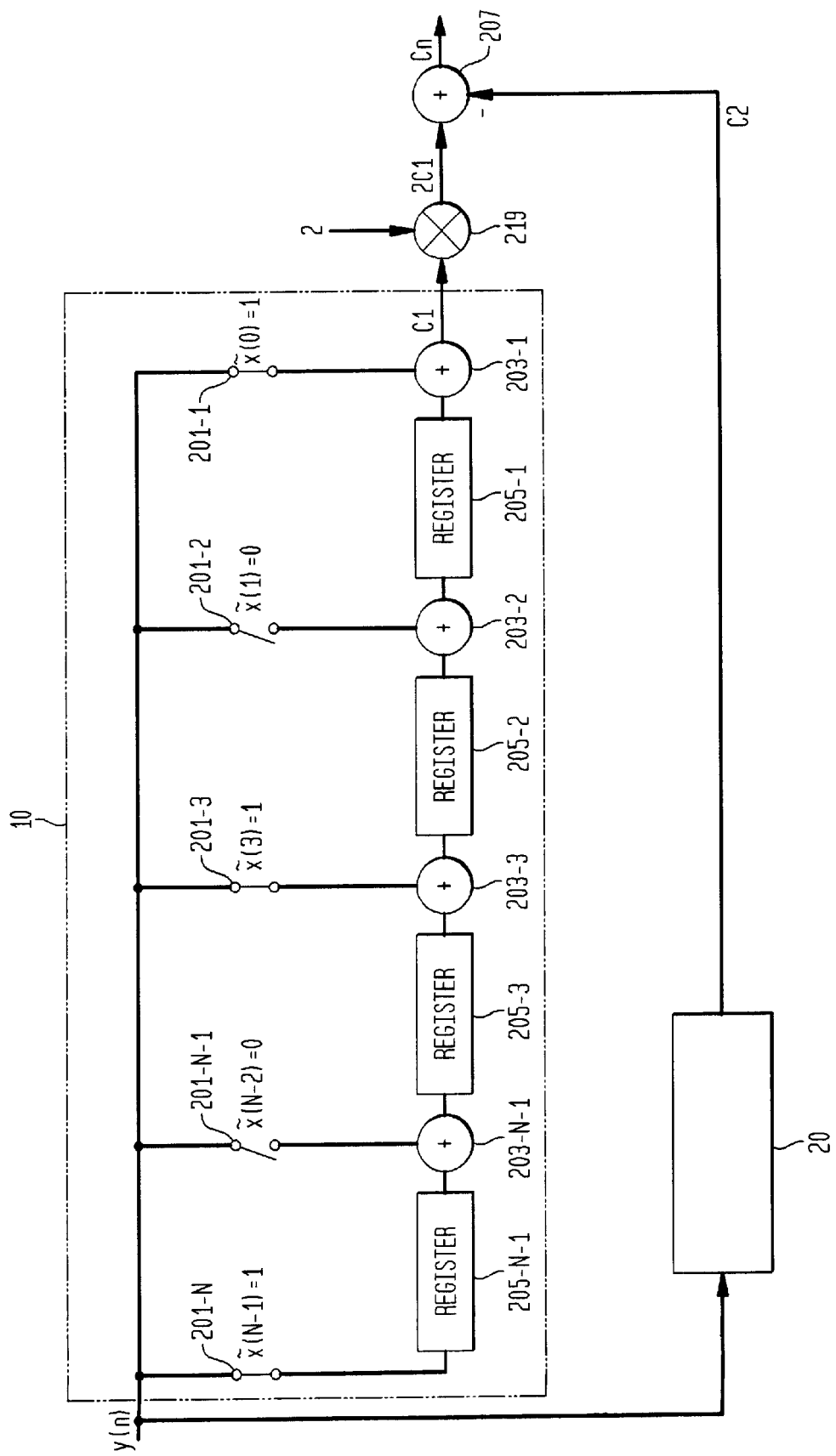
FIG. 3 shows another embodiment of the invention that is similar to the embodiment of the invention shown in FIG. 2.

FIG. 3 shows another embodiment of the invention which is similar to that shown in FIG. 2 but where the output of the filter is developed by computing $$C_n = \left[2\sum_{k=0}^{N-1} y(n-k) \cdot \frac{x(n)+1}{2} - \sum_{k=0}^{N-1} y(n-k)\right] = 2C1 - C2.$$

This, rather than computing $$C_n = 2\left[\sum_{k=0}^{N-1} y(n-k) \cdot \frac{x(k)+1}{2} - \frac{1}{2}\sum_{k=0}^{N-1} y(n-k)\right]$$

as is done in the embodiment of FIG. 2.

That is, in FIG. 3 the output C1 produced at the output of the first filter section is multiplied by 2 in multiplier 219 to produce 2C1. The output C2 from the second filter section 20 is then subtracted from 2C1 in an adder 207 to produce the desired results $C_n$. In FIG. 3, all elements which appear in FIG. 2 perform the same function as they do in FIG. 2, with the following exceptions. Multiplier 219 is inserted before adder 207. The output 2C1 from multiplier 219 is applied to a positive input of adder 207 while the output C2 from filter section 20 is applied to a negative input of adder 207. In FIG. 3, multiplier 209 of FIG. 2 is eliminated. Thus, the circuit of FIG. 3 is even simpler than that of FIG. 2, and consumes less power. Moreover, since no division is required, the result produced by the embodiment of FIG. 3 is more precise than that of FIG. 2.

A significant aspect of the invention is best explained with respect to FIGS. 2 and 3. Applicants recognized that when a filter coefficient (e.g., Xi) applied to a multiplier (switch) is "0", the output of the multiplier (switch) does not change. Thus, by way of example, if the Xi filter coefficient applied to "multiplying" element 201(i) is zero, the output of 201(i) is also zero. For this condition, adding the output of 201(i) with the output of the register stage 205(i) by means of adder 203(i) produces a sum at the output of 203(i) which is equal to the output of the register 205(i). However, applying the register output signals through the adder may cause substantial switching of the adder components resulting in significant power dissipation. Applicants further recognized that for this condition (i.e., when the filter coefficient is zero), the adder could be bypassed thereby eliminating power dissipation in that adder. Since on a statistical basis half of the filter coefficients are zero, bypassing the adders 203 whose associated multipliers, or switches, 201, have a zero coefficient applied to them results in a substantial reduction in the power dissipation in and along the adder chain.

Figure 4:
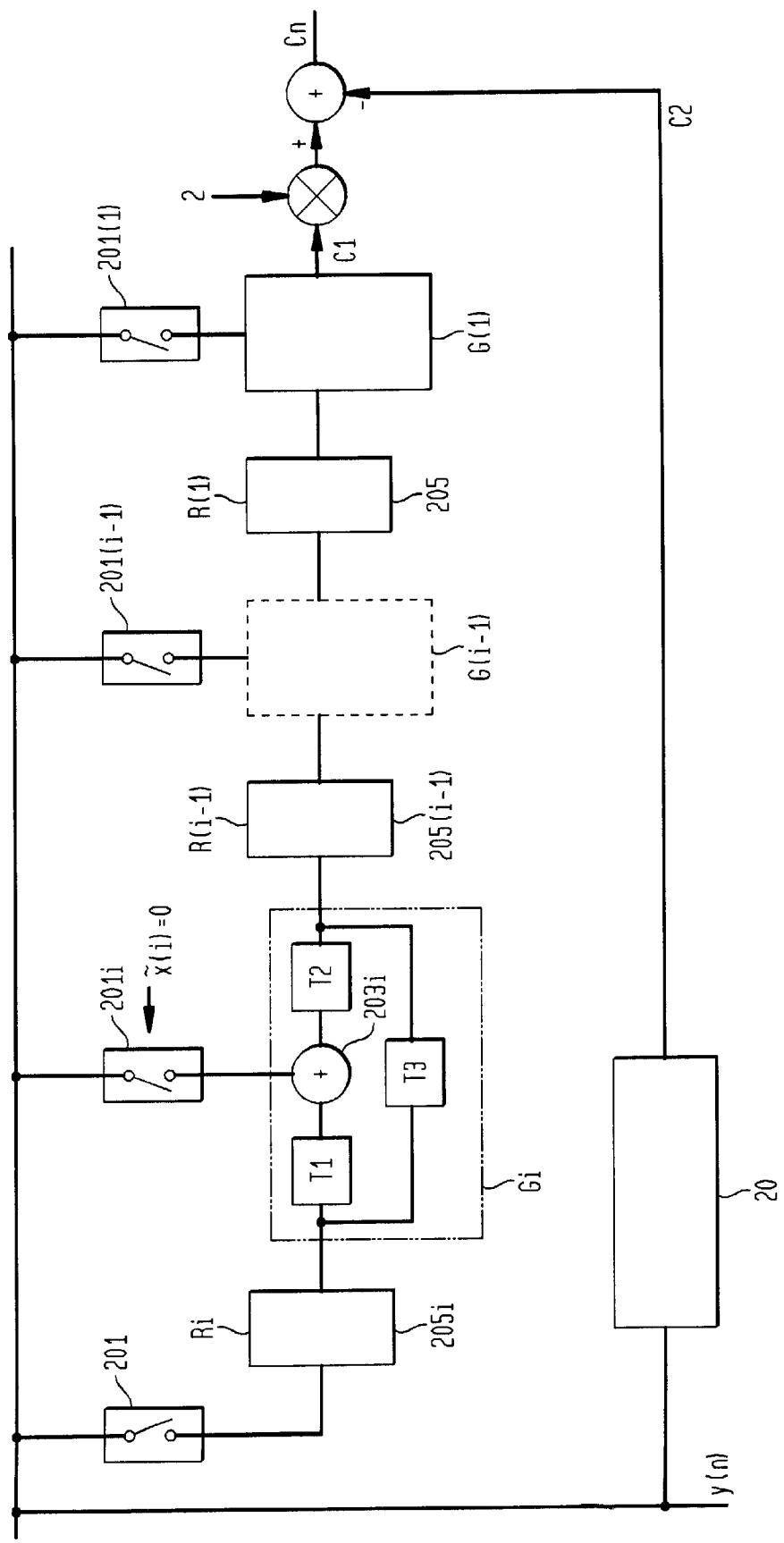
FIG. 4 shows an embodiment of the invention in which the adder circuits in the filter chain may be bypassed.
Figure 4A:
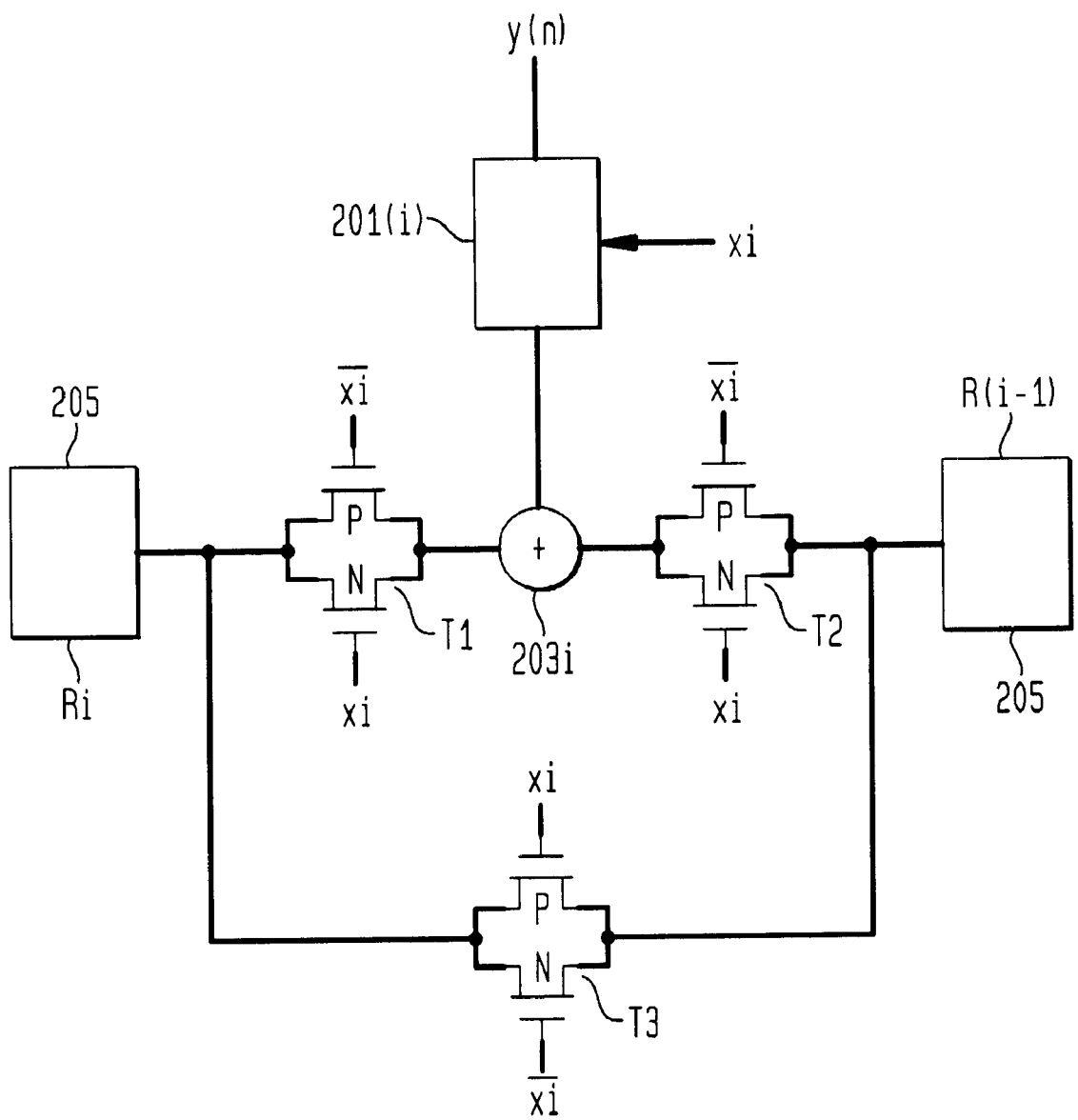
FIG. 4A is a more detached circuit diagram showing an adder with associated CMOS bypass circuitry in accordance with the invention.

Circuitry embodying this aspect of the invention includes a gating circuit (Gi) comprising an adder and transmission gate, as shown in FIGS. 4 and 4A. The outputs of a register Ri are coupled via a first transmission gate T1 to one of the input ports of an associated adder 203(i) while the other input port of adder 203(i) is connected to the output port of its corresponding "multiplier" 201(i). The output port of adder 203(i) is connected via a transmission gate T2 to the input port of a register R(i−1). A third transmission gate T3 is connected between the output of Ri and the input of R(i−1) to selectively bypass the combination of T1, adder 203 and T2, whereby, when T3 is enabled, the output of Ri is directly connected to the input of R(i−1). When the multiplier or switch 201(i) has a filter coefficient of "1" applied to it, the transmission gates T1 and T2 of Gi are turned on (enabled) and transmission gate T3 of Gi is turned off (disabled). Consequently, the output of multiplier 201(i) is added to the output of Ri in adder 203(i) and the output of the adder is supplied via gate T2 to the input of the next register R(i−1) along the chain. When the multiplier (switch) 201(i) has a filter coefficient of "0" applied to it, the transmission gates T1 and T2 of Gi are turned-off (disabled) and transmission gate T3 of Gi is turned-on (enabled). Consequently, gates T1 and T2 isolate the adder 203(i) from the output of Ri and the input of the next register R(i−1). Concurrently, gate T3 functions to bypass gates T1, T2 and adder 203(i) and to provide a direct connection between the output of Ri and the input of the next register R(i−1) along the chain. It should be evident that there would normally be one set of gates T1, T2 and T3 for each bit.

Transmission gates T1, T2 and T3 may be CMOS gates as shown in FIG. 4A, or any suitable transmission gates known in the art. As shown in FIG. 4A, transmission gates T1, T2, and T3 of a stage are controlled by signals (Xi and Xibar) derived from the filter coefficient (Xi) applied to that stage and are arranged such that when T1 and T2 are turned-on (enabled), T3 is turned-off (disabled); and when T1 and T2 are turned-off, T3 is turned-on. In FIG. 4A, three selectively enabled gating circuits are used. However, it should be appreciated that depending on the nature of the circuitry, it is possible to have a bypass circuit consisting of only T3, or only of T3 and T2.

Figure 5:
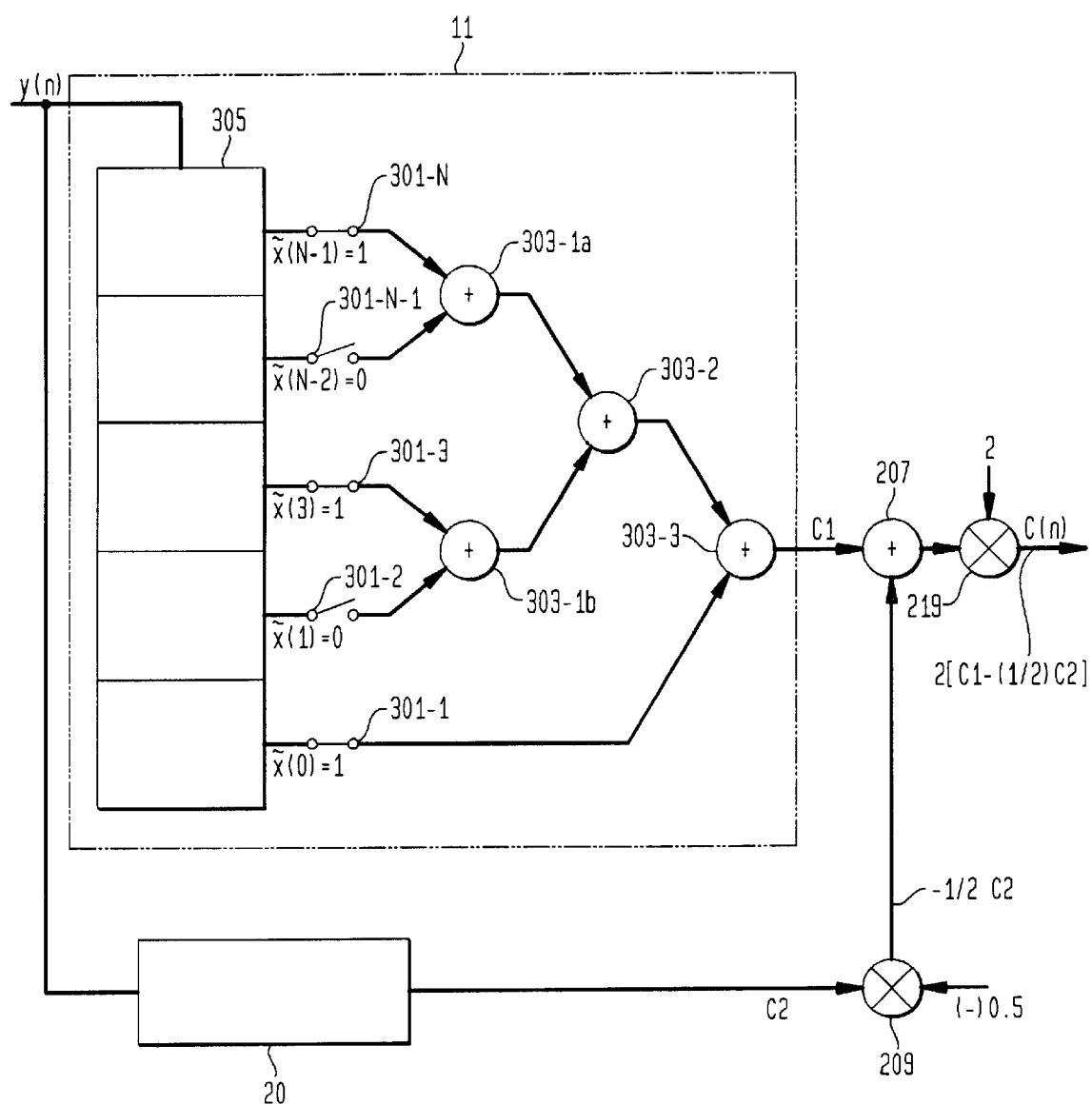
FIG. 5 shows an alternative arrangement for implementing a restructured filter in accordance with the principles of the invention but using an adder tree.

FIG. 5 shows an alternative embodiment of the invention which uses an adder tree to implement a restructured filter using the same computations employed in FIG. 2, i.e., $$C_n = 2\left[\sum_{k=0}^{N-1} y(n-k)\cdot \tilde{x}(k) - \frac{1}{2}\sum_{k=0}^{N-1} y(n-k)\right] = 2[C1 - (1/2)C2].$$

In FIG. 5, a first filter section 11 makes use of an adder tree configuration to produce a first output C1, which corresponds to the first output C1 produced by the filter configuration 10 in FIGS. 2 and 3. The second filter section 20 in FIG. 5, for producing the second output C2, is the same as the like numbered sections in FIGS. 2 and 3.

In FIG. 5, the input samples y(n) are supplied to an N-location shift register 305. Each sample stored in shift register 305 is supplied to a logic element shown as a switch 301. Similarly to logic elements 201, switches 301 implement the effective new coefficients $\tilde{x}(k)$ for the embodiment of the filter shown in FIG. 5. When the value of $\tilde{x}(k)$ applied to a switch 301 (or its control circuitry) is equal to 1, that switch 301 is closed (enabled) to provide a path between its associated shift register output and an input port to its associated adder located at the first level (e.g., 303-1a, 303-1b, etc.). Consequently a signal sample is then passed to the first level adder. When the value of $\tilde{x}(k)$ applied to a switch 301 (or its control circuitry) is 0, that switch is open (disabled) and the value of the signal sample is prevented from passing through the open switch. Instead a 0 is supplied via the switch 301 to its corresponding adder at the first level. The same structures used to implement switches 201 shown in FIGS. 6A and 6B may be used to implement switches 301.

Adders 303 are arranged in the form of an inverted adder tree. Each switch 301 is coupled to one input of a leaf one of the adders of the adder tree formed by adders 303. The output C1 of the adder 303-3 (at the trunk of the adder tree), which has the value of $$\sum_{k=0}^{N-1} y(n-k)\cdot \frac{x(k)+1}{2}$$

is supplied to an adder 207.

The second filter section 20 in FIG. 5 is the same as the like numbered section in FIGS. 2 and 3. Each one of circularly addressed memory 217, summer 215, accumulator register 213, multiplier 209 and adder 207 and initial values generator 243, performs in the same manner as it did in the embodiment shown in FIG. 2. As in FIG. 2, the second filter section produces an output C2 which is multiplied by negative ½ multiplier 209 to develop one half the sum of each of N latest sample values, i.e., to compute $$\frac{1}{2}\sum_{k=0}^{N-1} y(n-k).$$

As in FIGS. 2 and 3, circular memory 217 has the capacity to store N samples. The N latest sample values are stored in circularly addressed memory 217. The oldest sample value stored in circularly addressed memory 217 and the current sample value are supplied to summer 215. Summer 215 takes as an input the output from accumulator register 213, adds to it the current sample value y(n), subtracts from it the oldest sample value y(n−N), and supplies the resulting sum to both one input of multiplier 209 and also to the input of accumulator register 213, to be stored therein. Multiplier 209 multiplies the sum from summer 215 by the constant value of negative one-half (−0.5) and supplies the result to adder 207. Adder 207 adds its two inputs and supplies the result to times two multiplier 219 whose output defines the C(n) output of the filter, which is the same $$C_n = \sum_{k=0}^{N-1} y(n-k)\cdot x(k),$$

as described above.

Figure 7:
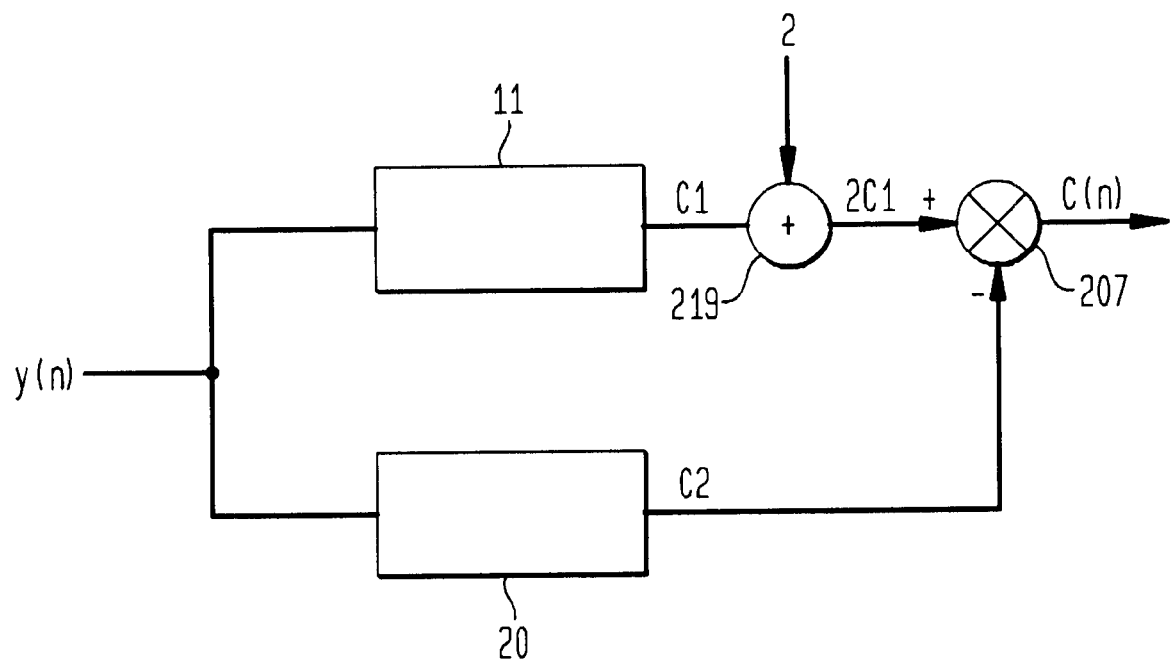
FIG. 7 shows another embodiment of the invention that is similar to the embodiment of the, invention shown in FIG. 5.

FIG. 7 shows another embodiment of the invention using an adder tree of the type shown in FIG. 5 but where the output of the filter is developed by computing $$C_n = \left[2\sum_{k=0}^{N-1} y(n-k)\cdot \tilde{x}(k) - \sum_{k=0}^{N-1} y(n-k)\right] = 2C1 - C2.$$

The circuit of FIG. 7 is similar to that of FIG. 5 except that the output C1 is supplied to a times-two multiplier 219 to produce 2C1 which is then supplied to an input port of an adder 207. In FIG. 7, as in FIG. 3, the output C2 of the second filter section 20 is supplied to a negative input port of an adder 207 to produce 2C1−C2 at the output of adder 207 which results in producing the desired C(n) function.

Note that switches 201 or 301 that represent a 0, and hence are open, may be left out in hardwired designs.

It should be understood that the term "filter coefficient" may also be referred to in the accompanying claims as filter coefficient vector, or filter tap weight or filter tap weight vector.

It should be appreciated that any circuit which can compute C1 and any circuit which can compute C2 may be used to practice the invention. It should also be appreciated that any suitable circuitry can be used to produce the multiplication function, the addition function and the gating functions used to practice the invention. Also, in the discussion above, it has been assumed that when the filter coefficient is 0, the corresponding switch is open and when the filter coefficient is 1, the corresponding switch is closed. It should be understood that the operation may be just the opposite; i.e., for X=0, the switch is closed and for X=1, the switch is open.

The transformation of equation 1 expressed as $$C_n = \sum_{k=0}^{N-1} y(n-k) \cdot x(k)$$

to the form shown in equation 2 expressed as $$C_n = 2\left[\sum_{k=0}^{N-1} y(n-k) \cdot \tilde{x}(k) - \frac{1}{2}\sum_{k=0}^{N-1} y(n-k)\right]$$

is as follows. Starting with $$\sum_{k=0}^{N-1} y(n-k) \cdot x(k), \sum_{k=0}^{N-1} y(n-k)$$

is added and then subtracted therefrom, to yield $$\sum_{k=0}^{N-1} y(n-k) \cdot x(k) + \sum_{k=0}^{N-1} y(n-k) - \sum_{k=0}^{N-1} y(n-k).$$

Grouping the sums together and multiplying the grouped sum by 2 while each of its constituent terms are divided by 2 forms $$2\left[\sum_{k=0}^{N-1} \frac{y(n-k) \cdot x(k)}{2} + \sum_{k=0}^{N-1} \frac{y(n-k)}{2} - \sum_{k=0}^{N-1} \frac{y(n-k)}{2}\right].$$

Factoring and regrouping yields $$2\left[\sum_{k=0}^{N-1} y(n-k) \cdot \frac{x(k)+1}{2} - \frac{1}{2}\sum_{k=0}^{N-1} y(n-k)\right].$$

Substituting $\tilde{x}(k)$ for $$\frac{x(k)+1}{2},$$

when x(k) is −1 or 1 results in $$2\left[\sum_{k=0}^{N-1} y(n-k) \cdot \tilde{x}(k)\frac{1}{2} - \sum_{k=0}^{N-1} y(n-k)\right],$$

where $\tilde{x}(k)$ is 0 or 1.

Similarly, the transformation of equation 1 to the form shown in equation 3 expressed as $$Cn = \left[2\sum_{k=0}^{N-1} y(n-k) \cdot \frac{x(k)+1}{2} - \sum_{k=0}^{N-1} y(n-k)\right]$$

is as follows. Starting with $$\sum_{k=0}^{N-1} y(n-k) \cdot x(k), \sum_{k=0}^{N-1} y(n-k)$$

is added and then subtracted therefrom, to yield $$\sum_{k=0}^{N-1} y(n-k) \cdot x(k) + \sum_{k=0}^{N-1} y(n-k) - \sum_{k=0}^{N-1} y(n-k).$$

Recombining terms results in $$\left[\sum_{k=0}^{N-1} y(n-k) \cdot x(k) + \sum_{k=0}^{N-1} y(n-k)\right] - \sum_{k=0}^{N-1} y(n-k),$$

after which the leftmost bracketed term is multiplied by 2 while each of its constituent terms are divided by 2 to form $$2\left[\sum_{k=0}^{N-1} \frac{y(n-k) \cdot x(k)}{2} + \sum_{k=0}^{N-1} \frac{y(n-k)}{2}\right] - \sum_{k=0}^{N-1} y(n-k).$$

Thereafter, the expression is factored to yield $$\left[2\sum_{k=0}^{N-1} y(n-k) \cdot \frac{x(k)+1}{2} - \sum_{k=0}^{N-1} y(n-k)\right].$$

Substituting $\tilde{x}(k)$ for $$\frac{x(k)+1}{2},$$

when x(k) is −1 or 1 results in $$\left[2\sum_{k=0}^{N-1} y(n-k) \cdot \frac{x(k)+1}{2} - \sum_{k=0}^{N-1} y(n-k)\right],$$

where $\tilde{x}(k)$ is 0 or 1.

Figure 8:
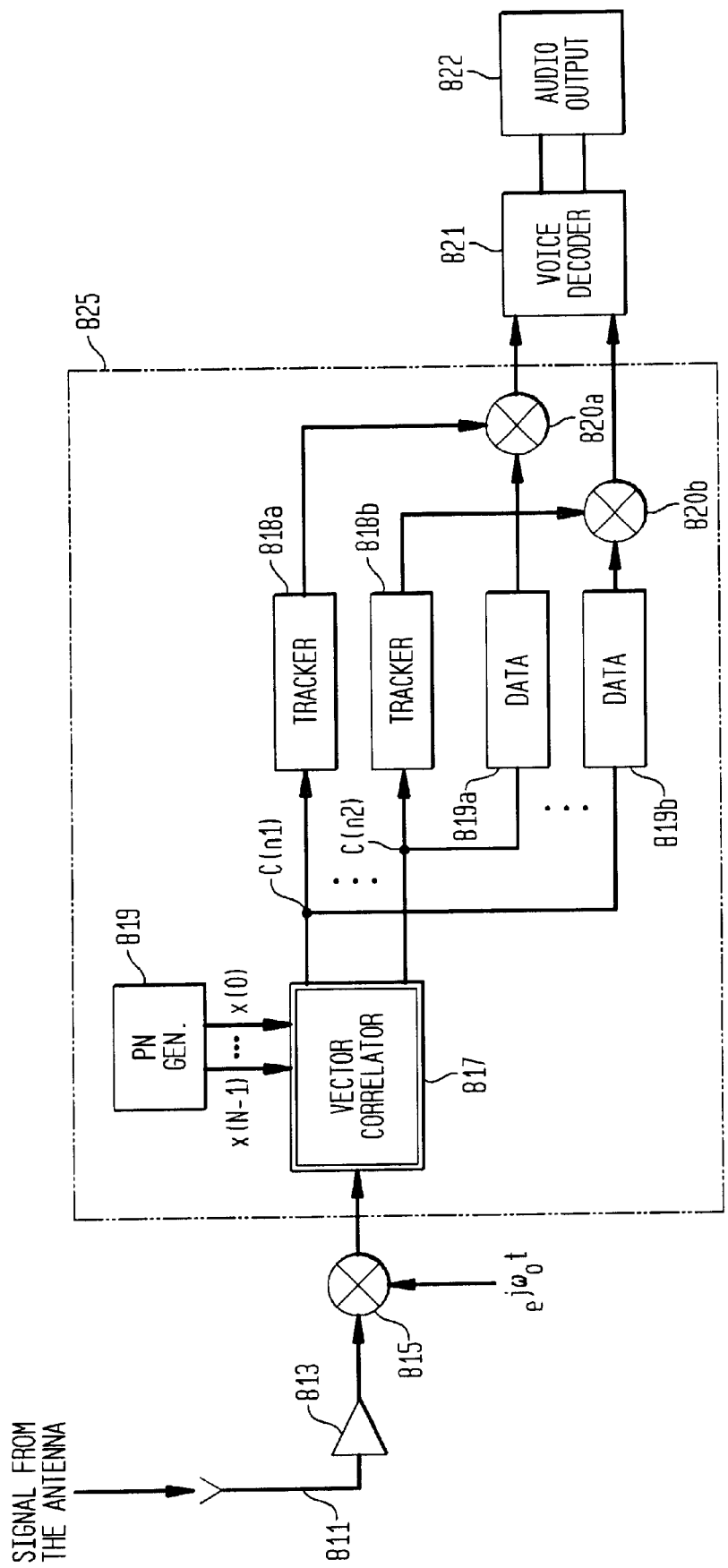
FIG. 8 is a block diagram of a system incorporating a filter embodying the invention.

A filter embodying the invention may be incorporated in a code division multiple access (CDMA) wireless telephone receiver of the type shown in FIG. 8. Referring to FIG. 8, there is shown an antenna 811 feeding an amplifier 813 whose output is supplied to a demodulator 815 whose data output is supplied to a vector correlator 817 to which is coupled a filter coefficients generator 819. The vector correlator 817 may, for example, include any of the filter circuitry shown in FIGS. 3–7. The coefficients generator 819 is a state machine programmed to generate the filter coefficients x(k) supplied to the filter embodying the invention. The outputs from the vector correlator are applied to tracker circuits 818a, 818b and to data processing circuits 819a, 819b whose outputs are respectively combined in demodulator circuits 820a, 820b.

The demodulated data outputs of the demodulators 820a, 820b are then supplied to a voice decoder 821 to produce an audio output. The vector correlator 817, the coefficients generator 819, the tracker circuits 818a and 818b, and the data processing circuits 819a and 819b may be formed as part of a digital signal processing (DSP) integrated circuit (IC) 825. That is, the circuitry would be part of an application specific integrated circuit (ASIC) designed to filter and process received signals. Alternatively, the vector correlator 817 which includes a filter embodying the invention may be formed as a stand alone integrated circuit.

The foregoing merely illustrates the principles of the inventions. It will be appreciated that those skilled in the art will be able to devise various arrangements which, although not explicitly described or shown herein, embody the principles of the invention and are included within its spirit and scope.

What is claimed is:

1. A filter comprising:
   an N-stage finite impulse response (FIR) filter adapted to receive input vector samples and filter tap weights for producing a first output which is the dot product of a received input vector and filter tap weights having a value of either 0 or 1; and
   a compensation circuit for transforming said first output into a final output having a value that would have been produced by an N-stage FIR filter for producing the dot product of a received input vector and filter tap weights having values of –1 and 1.

2. A filter as claimed in claim 1 wherein said N-stage FIR filter comprises a plurality of selected stages and wherein each one of the selected stages of said N-stage FIR filter for producing a first output includes a multiplier, and wherein each multiplier of a stage includes a logic element, with each logic element for either (i) passing a received input vector when the filter tap weight applied to its multiplier has a value of 1, and (ii) blocking passage of said received input vector when the filter tap weights applied to the multiplier of the stage has a value of 0.

3. A filter as claimed in claim 1 wherein said N-stage FIR filter comprises a plurality of selected stages and wherein each one of the selected stages of said N-stage FIR filter for producing a first output includes:
   a multiplier, an adder and a register;
   wherein each multiplier has a first input port to which is applied a received input vector and a second input port to which is applied a filter tap weight having a value of either 1 or 0;
   wherein each multiplier has an output port which is coupled to a first input port of the adder of that stage;
   wherein the adder of the stage has a second input port which is coupled to an output port of the register of that stage; and
   wherein the adder of the stage has an output port which is coupled to the input port of a register of a subsequent stage.

4. A filter as claimed in claim 3, wherein the adder of a stage is bypassed so that the output port of a register is connected to the input port of the succeeding register when the filter tap weight applied to the multiplier of that stage is a predetermined one of 0 and 1.

5. A filter as claimed in claim 3, wherein bypass circuitry is coupled between the output port of the register of one stage and the input port of the register of a subsequent stage to bypass the adder of the one stage when the filter tap weight applied to the multiplier of the one stage is a predetermined one of 0 and 1.

6. A filter as claimed in claim 3, wherein, when the filter tap weight is a predetermined one of one value of 0 and 1, the outputs of the multiplier and of the register of the stage are summed in the adder of that stage and the output of the adder is supplied to the inputs of the register of a subsequent stage; and wherein, when the filter tap weight is of the other value of 0 and 1, the adder of the stage is bypassed and the output port of the register of the stage is coupled to the input port of the register of the subsequent stage.

7. A filter as claimed in claim 3, wherein a first selectively enabled gating means is coupled between the output of one register and the input to a subsequent register for selectively bypassing the adder coupled between the two registers.

8. A filter as claimed in claim 3,
   wherein the output port of the register of the one stage is coupled via a first selectively enabled gating means to the input port of the register of the subsequent stage; and
   wherein the output port of the adder of one stage is coupled via a second selectively enabled gating means to the input port of a register of a subsequent stage.

9. A filter as claimed in claim 8,
   wherein the output port of the register of the one stage is coupled via a third selectively enabled gating means to the second input port of the adder of that stage; and
   wherein when the filter tap weight has one value, the first and third selectively enabled gating means are enabled and the second selectively enabled gate is disabled; and wherein when the filter tap weight has the other value, the first and third selectively enabled gating means are disabled and the second selectively enabled gating means is enabled.

10. A filter as claimed in claim 1, wherein said N-stage FIR filter for producing a first output, C1, includes a first circuit for computing said first output, C1, which is equal to $$\sum_{k=0}^{N-1} y(n-k) \cdot \frac{x(k)+1}{2},$$

where y(n–k) is the filter input at time n–k, x(k) is the filter coefficient for the $k^{th}$ stage of the filter, and [x(k)+1]/2 is equal to x̃(k) which is either 0 or 1, and said first circuit for supplying the result as said first output; and
   wherein said compensation circuit includes:
      a second circuit for developing a second output, C2, said second circuit for computing $$\sum_{k=0}^{N-1} y(n-k)$$

and supplying the result as said second output; and
      a third circuit for combining said first output and said second output to produce said final output of said filter.

11. A filter as claimed in claim 10 wherein said third circuit includes multiplying means and adding means for producing said final output having a value of 2C1 minus C2.

12. A filter as claimed in claim 10 wherein said third circuit includes multiplying means and adding means for producing 2[C1−(½)C2].

13. A filter structure as claimed in claim 10 wherein each intermediate stage of said N-stage FIR filter for producing a first output comprises:

a multiplier having first and second input ports and an output port, an adder having first and second input ports and an output port and a memory element having an input port and an output port;
wherein a received input vector comprises the signals to the filter and wherein said filter tap weights are the filter coefficients having a value of either 1 or 0, which are respectively applied to the input ports of the multiplier;
wherein the output port of the multiplier is coupled to one of the input ports of the adder of that stage;
wherein the output port of the memory element is coupled to the other input port of the adder of that stage; and
wherein the output port of the adder of a stage is coupled to the input port of a memory element of a subsequent stage.

14. A filter as claimed in claim 10 wherein said second circuit includes a circulating memory, an adder and an accumulator register for producing said second output.

15. A method for performing filtering on input samples comprising the steps of:

filtering said input samples using an N-stage finite impulse response (FIR) filter employing coefficients having a value of only 0 or 1 to produce a first filtered output; and
applying a compensation function to said first filtered output for producing an output signal equal to that produced by an N-stage FIR filter whose filter coefficients are ±1.

16. A method as claimed in claim 15 wherein said step of filtering is performed by closing switches so as to pass input samples that are being multiplied by a coefficient value of 1 and opening switches so as to block passage of samples that are being multiplied by a coefficient value of 0.

17. A method as claimed in claim 15 wherein said applying step includes the steps of:

subtracting an oldest sample and adding a newest sample stored in a circularly addressed memory to a stored value of a sum of previously received sample values; and
dividing the result of said subtracting and adding step by two.

18. A method as defined in claim 15 wherein said applying step includes the steps of:

subtracting an oldest sample and adding a newest sample stored in a circularly addressed memory to a stored value of a sum of previously received sample values;
subtracting one half the result of said subtracting and adding from said filtered output; and
multiplying the result of said subtracting step by two.

19. A method as claimed in claim 15 wherein said applying step includes the steps of:

subtracting an oldest sample and adding a newest sample stored in a circularly addressed memory to a stored value of a sum of previously received sample values;
doubling the result of said filtered output by two; and
subtracting the result of said subtracting and adding from said doubled filtered output.

20. A method as claimed in claim 15 wherein the filtering step includes the step of computing $$\sum_{k=0}^{N-1} y(n-k) \cdot \frac{x(k)+1}{2},$$

where y(n−k) is the filter input at time n−k, x(k) is the filter coefficient for the $k^{th}$ stage of the filter, and [x(k)+1]/2 is equal to $\tilde{x}(k)$ which is either 0 or 1, and for supplying the result as a first output;

wherein the step of applying a compensation function includes the step of computing $$\sum_{k=0}^{N-1} y(n-k)$$

and supplying the result as a second output; and combining said first output and said second output to produce an output of said filter.

21. A method as claimed in claim 15 wherein said combining step includes the steps of multiplying said first output by 2 and subtracting therefrom the value of said second output.

22. A method as claimed in claim 15 wherein said combining step includes the steps of subtracting ½ the value of said second output from said first output and then multiplying the result by two.

23. A method for performing filtering on input samples comprising the steps of:

computing $$\sum_{k=0}^{N-1} y(n-k) \cdot \frac{x(k)+1}{2},$$

where y(n−k) is the filter input at time n−k, x(k) is the filter coefficient for the $k^{th}$ stage of the filter, and [x(k)+1]/2 is equal to $\tilde{x}(k)$ which is either 0 or 1, and for supplying the result as a first output;

computing $$\sum_{k=0}^{N-1} y(n-k)$$

and supplying the result as a second output; and combining said first output and said second output to produce an output of said filter.

24. A method as claimed in claim 23 wherein said combining step includes the steps of multiplying said first output by 2 and subtracting therefrom the value of said second output.

25. A method as claimed in claim 23 wherein said combining step includes the steps of subtracting ½ the value of said second output from said first output and then multiplying the result by two.

26. A filter comprising:

A first circuit for developing a first output, said first circuit for computing $$\sum_{k=0}^{N-1} y(n-k) \cdot \frac{x(k)+1}{2},$$

where y(n−k) is the sampled filter input at time n−k, x(k) is the filter coefficient for the $k^{th}$ stage of the filter, and [x(k)+1]/2 is equal to x̄(k) which is either 0 or 1, and supplying the result as said first output;

a second circuit for developing a second output, said second circuit for computing $$\sum_{k=0}^{N-1} y(n-k)$$

and supplying the result as a second output; and a combiner circuit for combining said first output and said second output to produce an output of said filter.

27. A filter as claimed in claim 26 wherein said combiner circuit includes circuitry for multiplying said second output by one-half and subtracting the result from the first output and then multiplying the result of the subtraction by two.

28. A filter as claimed in claim 26 wherein said combiner circuit includes circuitry for multiplying said first output defined as C1 and said second output defined as C2, and wherein said combiner circuit includes circuitry for multiplying said first output by two and then subtracting therefrom said second output for producing and output of said filter equal to 2C1−C2.

29. A filter as claimed in claim 26 wherein said combiner combines said first and second outputs to produce, as said output of said filter, $$\left[ 2\sum_{k=0}^{N-1} y(n-k) \cdot \frac{x(k)+1}{2} - \sum_{k=0}^{N-1} y(n-k) \right].$$

30. A filter as claimed in claim 26 wherein said first circuit includes an N-stage finite impulse response (FIR) filter implementing filter coefficients having a value of either 0 or 1.

31. A filter as claimed in claim 30 wherein said combiner circuit is for combining said first and second outputs to produce a third output having a value equal to one that would have been produced by an N-stage FIR filter implementing filter coefficients having values of −1 and 1.

32. A filter as claimed in claim 30 wherein each stage of said N-stage FIR filter includes a multiplier adapted to receive a filter input signal and a filter coefficient having a value of either one or zero, and wherein each multiplier includes a logic element, with each logic element for either (i) passing a filter input signal when the filter coefficient applied to its multiplier has a value of 1, and (ii) blocking passage of said filter input signal when the filter coefficient applied to its multiplier has a value of 0.

33. A filter as claimed in claim 30 wherein each intermediate stage of said N-stage FIR filter includes:

a multiplier, an adder and a register;
wherein each multiplier has a first input port to which is applied a filter input signal and a second input port to which is applied a filter coefficient having a value of either 1 or 0;
wherein each multiplier has an output port which is coupled to a first input port of the adder of that stage;
wherein the adder of the stage has a second input port which is coupled to an output port of the register of that stage; and
wherein the adder of the stage has an output port which is coupled to the input port of a register of a subsequent stage.

34. A filter as claimed in claim 30 wherein each intermediate stage of said N-stage FIR filter includes a multiplexer, an adder and a memory element;
wherein a filter input signal and a filter coefficient having a value of either 1 or 0 are applied to the inputs of the multiplier; and
wherein the outputs of the memory elements of a stage and the outputs of the multiplier are applied to the inputs of an adder.

35. A filter comprising:
an N-stage finite impulse response (FIR) filter adapted to receive input signals and filter coefficients for producing a first output which is the dot product of said received input signals and said filter coefficients, where said filter coefficients have a value of either 0 or 1; and
a compensation circuit for transforming said first output into a final output having a value that would have been produced by an N-stage FIR filter for producing the dot product of a received input vector and filter tap weights having values of −1 and 1.

36. A filter as claimed in claim 35 wherein said N-stage FIR filter for producing a first output includes a multiplier at each one of it stages, and wherein each multiplier includes a logic element, with each logic element for either (i) passing an input sample when the filter coefficient applied to its multiplier has a value of 1, and (ii) blocking passage of said input sample when the filter coefficient applied to its multiplier has a value of 0.

37. A filter as claimed in claim 35 wherein said N-stage filter for producing a first output includes:
a plurality of switches, certain of said switches coupling an input sample to an adder when said input sample is multiplied in said N-stage filter by a filter coefficient having a value of 1, said coupling being via at least a register, the remainder of said switches blocking passage of an input sample when said input sample is multiplied by a filter coefficient having a value of 0.

38. A filter as claimed in claim 35 wherein said N-stage filter for producing a first output comprises:
a plurality of less than N links, each of said links passing an input sample when said input sample is multiplied in said N-stage filter by a filter coefficient having a value of 1.

39. A filter as claimed in claim 35 wherein said N-stage filter for producing a first output comprises:
a plurality of less than N links, each of said links passing an input sample when said input sample is multiplied in said N-stage filter by a filter coefficient having a value of 1.

40. A filter as claimed in claim 35 wherein said N-stage filter for producing a first output comprises:
a plurality of switches, each of said switches passing an input sample from a memory to a leaf adder of an adder tree when said input sample is multiplied in said N-stage filter by a filter coefficient having a value of 1, and blocking passage said input sample when said input sample is multiplied by a filter coefficient having a value of 0.

41. A filter as claimed in claim 35 wherein said N-stage filter for producing a first output comprises:
a memory for storing N input samples; and
a plurality of switches, each of said switches passing an input sample from a memory to a leaf adder of an adder tree when said input sample is multiplied in said N-stage filter by a filter coefficient having a value of 1, and blocking passage said input sample when said input sample is multiplied by a filter coefficient having a value of 0.

42. A filter as claimed in claim 35 wherein said compensation circuit includes means for determining one half the sum of the N latest received samples, comprising:
   means for determining the sum of said N latest received samples; and
   means for multiplying said sum by negative one half.

43. A filter as claimed in claim 35 wherein said compensation circuit includes means for determining a sum of the N latest received samples, comprising:
   a circularly addressed memory for storing N samples;
   an accumulator memory; and
   a summer for adding the newest of said samples to, and subtracting the oldest of said samples from a value stored in said accumulator memory, and for providing a result to be stored in said accumulator memory.

44. A filter as claimed in claim 35 wherein said compensation circuit includes means for determining one half the sum of the N latest received samples, comprising:
   a circularly addressed memory for storing N samples;
   an accumulator memory;
   a summer for adding the newest of said samples to, and subtracting the oldest of said samples from a value stored in said accumulator memory, and for providing a result to be stored in said accumulator memory; and
   means for multiplying said sum by negative one half.

45. An N-stage finite impulse response (FIR) filter structure, comprising:
   an N-stage filter implementing filter coefficients having a value of either 0 or 1 and supplying a filtered output value;
   a circularly addressed memory for storing N samples;
   an accumulator memory;
   a summer for adding the newest of said samples to, and subtracting the oldest of said samples from a value stored in said accumulator memory, and for providing a result to be stored in said accumulator memory defining a second output value; and
   a combination circuit including a subtractor for subtracting said second output value from double said filtered output value.

46. An N-stage finite impulse response (FIR) filter structure, comprising:
   an N-stage filter implementing filter coefficients having a value of either 0 or 1 and supplying a filtered output value;
   a circularly addressed memory for storing N samples;
   an accumulator memory;
   a summer for adding the newest of said samples to, and subtracting the oldest of said samples from a value stored in said accumulator memory, and for providing a result to be stored in said memory; and
   a combiner circuit combining an output of said summer with said filtered output value.

47. An integrated circuit (IC) comprising:
   an N-stage finite impulse response (FIR) filter adapted to receive input vector samples and filter tap weights for producing a first output which is the dot product of a received input vector and filter tap weights having a value of either 0 or 1; and
   a compensation circuit for transforming said first output into a final output having a value that would have been produced by an N-stage FIR filter for producing the dot product of a received input vector and filter tap weights having values of −1 and 1.

48. An IC as claimed in claim 47 further including a filter coefficients generator formed on said IC for supplying the filter tap weights.

49. An IC as claimed in claim 48 wherein said N-stage FIR filter comprises a plurality of selected stages and wherein each one of said selected stages of said N-stage FIR filter for producing a first output includes a multiplier, and wherein each multiplier includes a logic element, with each logic element for either (i) passing a received input vector when the filter tap weight applied to its multiplier has a value of 1, and (ii) blocking passage of said received input vector when the filter tap weights applied to its multiplier has a value of 0.

50. An IC as claimed in claim 48 wherein said N-stage FIR filter comprises a plurality of selected stages and wherein each one of said selected stages of said N-stage
   FIR filter for producing a first output includes:
      a multiplier, an adder and a register;
         wherein each multiplier has a first input port to which is applied a received input vector and a second input port to which is applied a filter tap weight having a value of either 1 or 0;
         wherein each multiplier has an output port which is coupled to a first input port of the adder of that stage;
         wherein the adder of the stage has a second input port which is coupled to an output port of the register of that stage; and
         wherein the adder of the stage has an output port which is coupled to the input port of a register of a subsequent stage.

51. A filter as claimed in claim 50, wherein the adder of a stage is bypassed so that the output port of a register is connected to the input port of the succeeding register when the filter tap weight applied to the multiplier of that stage is a predetermined one of 0 and 1.

52. A filter as claimed in claim 50, wherein bypass circuitry is coupled between the output port of the register of one stage and the input port of the register of a subsequent stage to bypass the adder of the one stage when the filter tap weight applied to the multiplier of the one stage is a predetermined one of 0 and 1.

53. An IC as claimed in claim 50, wherein, when the coefficients generator supplies filter tap weights which are a predetermined one of 0 and 1, the outputs of the multiplier and of the register of the stage are summed in the adder of that stage and the output of the adder is supplied to the inputs of the register of a subsequent stage; and wherein, when the filter tap weight is of the other value of 0 and 1, the adder of the stage is bypassed and the output port of the register of the stage is coupled to the input port of the register of the subsequent stage.

54. An IC as claimed in claim 50, wherein a first selectively enabled gating means is coupled between the outputs of one register and the inputs to a subsequent register for selectively bypassing the adder coupled between the two registers.

55. An IC as claimed in claim 50,
   wherein the output port of the register of the one stage is coupled via a first selectively enabled gating means to the input port of the register of the subsequent stage; and wherein the output port of the adder of one stage is coupled via a second selectively enabled gating means to the input port of a register of a subsequent stage.

56. A receiver comprising:

signal receiving circuitry coupled via a demodulator to a vector correlator, the vector correlator comprising:
  (a) an N-stage finite impulse response (FIR) filter adapted to receive input vector samples and filter tap weights for producing a first output which is the dot product of a received input vector and filter tap weights having a value of either 0 or 1; and
  (b) a compensation circuit for transforming said first output into a final output having a value that would have been produced by an N-stage FIR filter for producing the dot product of a received input vector and filter tap weights having values of −1 and 1.

57. A receiver as claimed in claim 56 including a filter coefficients generator for supplying the filter tap weights to the vector correlator.

58. A receiver as claimed in claim 57 including demodulating circuitry coupled to the filter for producing demodulated data coupled to a voice decoder for producing an audio output.

59. A receiver as claimed in claim 57 wherein said N-stage FIR filter comprises a plurality of selected stages and each one of said selected stages of said N-stage FIR filter for producing a first output includes a multiplier, and wherein each multiplier includes a logic element, with each logic element for either (i) passing a received input vector when the filter tap weight applied to its multiplier has a value of 1, and (ii) blocking passage of said received input vector when the filter tap weights applied to its multiplier has a value of 0.

60. A receiver as claimed in claim 58 wherein said N-stage FIR filter comprises a plurality of selected stages wherein each one of said selected stages of said N-stage FIR filter for producing a first output includes:

a multiplier, an adder and a register;
  wherein each multiplier has a first input port to which is applied a received input vector and a second input port to which is applied a filter tap weight having a predetermined value of either 1 or 0;
  wherein each multiplier has an output port which is coupled to a first input port of the adder of that stage;
  wherein the adder of the stage has a second input port which is coupled to an output port of the register of that stage; and
  wherein the adder of the stage has an output port which is coupled to the input port of a register of a subsequent stage.

61. A receiver as claimed in claim 60, wherein the adder of a stage is bypassed so that the output port of a register is connected to the input port of the succeeding register when the filter tap weight applied to the multiplier of that stage is a predetermined one of 0 and 1.

62. A receiver as claimed in claim 60, wherein bypass circuitry is coupled between the output port of the register of one stage and the input port of the register of a subsequent stage to bypass the adder of the one stage when the filter tap weight applied to the multiplier of the one stage is a predetermined one of 0 and 1.

63. A receiver as claimed in claim 60, wherein, when the coefficients generator supplies filter tap weights which are a predetermined one of 0 and 1, the outputs of the multiplier and of the register of the stage are summed in the adder of that stage and the output of the adder is supplied to the inputs of the register of a subsequent stage; and wherein, when the filter tap weight is of the other value of 0 and 1, the adder of the stage is bypassed and the output port of the register of the stage is coupled to the input port of the register of the subsequent stage.

64. A receiver as claimed in claim 60, wherein a first selectively enabled gating means is coupled between the outputs of one register and the inputs to a subsequent register for selectively bypassing the adder coupled between the two registers.

65. A receiver as claimed in claim 60, wherein the output port of the register of the one stage is coupled via a first selectively enabled gating means to the input port of the register of the subsequent stage; and wherein the output port of the adder of one stage is coupled via a second selectively enabled gating means to the input port of a register of a subsequent stage.

* * * * *